(12) United States Patent
McClay et al.

(10) Patent No.: US 6,480,330 B1
(45) Date of Patent: Nov. 12, 2002

(54) ULTRAVIOLET POLARIZATION BEAM SPLITTER FOR MICROLITHOGRAPHY

(75) Inventors: James A. McClay, Oxford; Ronald A. Wilklow, Fairfield; Matthew Gregoire, Redding, all of CT (US)

(73) Assignee: Silicon Valley Group, Inc., San Jose, CA (US)

( * ) Notice: Subject to any disclaimer, the term of this patent is extended or adjusted under 35 U.S.C. 154(b) by 0 days.

(21) Appl. No.: 09/538,529

(22) Filed: Mar. 30, 2000

Related U.S. Application Data
(60) Provisional application No. 60/184,782, filed on Feb. 24, 2000.

(51) Int. Cl.$^7$ .............................. G02B 5/28; G02B 5/30; G02B 27/14; G02B 27/28; G03B 1/08
(52) U.S. Cl. ...................... 359/359; 359/495; 359/496; 359/583; 359/638
(58) Field of Search ................................ 359/583, 359, 359/495, 496, 355, 638

(56) References Cited

U.S. PATENT DOCUMENTS

| | | | |
|---|---|---|---|
| 2,403,731 A | 7/1946 | MacNeille | 88/65 |
| 2,740,317 A | 4/1956 | Kelly et al. | 88/1 |
| 3,601,490 A | * 8/1971 | Erickson | 356/106 |
| 4,953,960 A | 9/1990 | Williamson | 350/442 |
| 5,220,454 A | * 6/1993 | Ichihara et al. | 359/487 |
| 5,339,441 A | 8/1994 | Kardos et al. | 359/352 |
| 5,400,179 A | * 3/1995 | Ito | 359/588 |
| 5,537,260 A | 7/1996 | Williamson | 359/727 |
| 5,691,802 A | 11/1997 | Takahashi | 355/53 |
| 5,694,241 A | 12/1997 | Ishiyama et al. | 359/364 |
| 5,808,805 A | 9/1998 | Takahashi | 359/651 |
| 5,879,820 A | 3/1999 | Quesnel et al. | 428/688 |
| 5,969,882 A | 10/1999 | Takahashi | 359/728 |
| 5,999,333 A | 12/1999 | Takahashi | 359/726 |

FOREIGN PATENT DOCUMENTS

| | | | |
|---|---|---|---|
| EP | 0 554 994 A1 | 8/1993 | G02B/17/08 |
| EP | 0 869 203 A2 | 10/1998 | C30B/29/12 |
| EP | 0 939 467 A2 | 9/1999 | H01S/3/08 |

OTHER PUBLICATIONS

Kolbe J. et al., "Optical Losses of Fluoride Coatings for UV/VUV Applications Deposited By Reactive IAD and IBS Processes," Annual Technical Conference Proceedings Society of Vacuum Coaters, 1993, pp. 44–50.

(List continued on next page.)

*Primary Examiner*—Cassandra Spyrou
(74) *Attorney, Agent, or Firm*—Sterne, Kessler, Goldstein & Fox P.L.L.C.

(57) ABSTRACT

The present invention provides an ultraviolet (UV) polarizing beam splitter cube. The UV polarizing beam splitter cube is transmissive to light at wavelengths equal to or less than 170 nm and can image, at high quality, light incident over a wide range of angles and including a numeric aperture greater than 0.6. The UV polarizing beam splitter cube comprises a pair of prisms that are made of at least a fluoride material, and a coating interface having at least one layer of a thin film fluoride material. Alternating layers of thin film fluoride materials can comprise a first fluoride material having a first refractive index and a second fluoride material having a second refractive index. The first and second fluoride materials form a stack of fluoride materials having relatively high and low refractive indices such that the coating interface separates UV light into two polarized states.

21 Claims, 11 Drawing Sheets

OTHER PUBLICATIONS

Solomon Musikant, "Optical Materials, an Introduction to Selection and Application," *Optical Engineering,* vol. 6, 1985, pp. 98–105.

Wu F. et al., "Calcite/Barium Fluoride Ultraviolet Polarizing Prism," *Applied Optics,* US, Optical Society of America, Washington, vol. 34, No. 19, Jul. 1, 1995, pp. 3668–3670.

"Waveplates," 2 pages, internet cite: http://www.casix,com/new/waveplate.htm, printed date Nov. 12, 1999.

"Right–Angle Prisms," Casix, Inc., www.casix,com/old%20web/table/prism02.htm, copyright 1998, last revised—Jan. 28, 1999, 2 pages.

"Fused Silica Right–Angle Prism," Casix, Inc., www.casix.com/old%20web/table/prism02–fs.htm, copyright 1998, last revised—Jan. 29, 1999, 2 pages.

"Beamsplitters," Casix, Inc., www.casix.com/old%20web/optics/optics08.htm, copyright 1998, last revised—Jan. 29, 1999, 2 pages.

"Beamsplitter Penta Prisms," Casix, Inc., www.casix.com/old%20web/table/prism01–bs.htm, copyright 1998, last revised—Jan. 29, 1999, 1 page.

"Polarization Beamsplitter," Casix, Inc., www.casix.com/old%20web/table/beamsplitter03.htm, copyright 1998, last revised—Jan. 29, 1999, 1 page.

"Beamsplitter Plates," Casix, Inc., www.casix.com/old%20web/table/beamsplitter01–sin.htm, copyright 1998, last revised—Jan. 29, 1999, 1 page.

"Beamsplitter Cube," Casix, Inc., www.casix.com/old%20web/table,beamsplitter02.htm, copyright 1998, last revised—Jan 29, 1999, 1 page.

"Prisms," Casix, Inc., www.casix.com/old%20web/optics06.htm, copyright 1998, last revised—Oct. 20, 1998, 3 pages.

Nonogaki et al., "Microlithography Fundamentals in Semiconductor Devices and Fabrication Technology," (Marcel Dekker, Inc.: New York, N.Y. 1998), pp. 1 through 25.

* cited by examiner

| ELEMENT | MATERIAL | INDEX OF REFRACTION |
|---|---|---|
| PRISMS 310, 350 | $CaF_2$, $BaF_2$ | |
| LAYERS 331–337 | $GdF_3$, $LaF_3$ | HIGH $n_1$ |
| LAYERS 341–346 | $MgF_2$, $AlF_3$ | LOW $n_2$ |
| LAYER 351 | QUARTZ | |

FIG.4

| SYSTEM NUMERIC APERATURE (NA) | ANGLES | | WAVELENGTH U.V. |
|---|---|---|---|
| | $\alpha_R$ | $\alpha_T$ | |
| 0.5 | 45°±5° | 45°±12° | <170nm (e.g. 157nm) |
| 0.6 | 45°±7° | 45°±15° | <170nm |
| 0.75 | 45°±10° | 45°±10° | <170nm |

FIG.8

ULTRAVIOLET POLARIZATION BEAM SPLITTER FOR MICROLITHOGRAPHY

CROSS-REFERENCE TO RELATED APPLICATION

This application claims the benefit of priority to U.S. application Ser. No. 60/184,782, filed Feb. 24, 2000 (incorporated in its entirety herein by reference).

BACKGROUND OF THE INVENTION

1. Field of the Invention

The present invention pertains to optics, and in particular, to optics in microlithography.

2. Related Art

Photolithography (also called microlithography) is a semiconductor fabrication technology. Photolithography uses ultraviolet or visible light to generate fine patterns in a semiconductor device design. Many types of semiconductor devices, such as, diodes, transistors, and integrated circuits, can be fabricated using photolithographic techniques. Exposure systems or tools are used to carry out photolithographic techniques, such as etching, in semiconductor fabrication. An exposure system can include a light source, reticle, optical reduction system, and a wafer alignment stage. An image of a semiconductor pattern is printed or fabricated on the reticle (also called a mask). A light source illuminates the reticle to generate an image of the particular reticle pattern. An optical reduction system is used to pass a high-quality image of the reticle pattern to a wafer. See, Nonogaki et al., *Microlithography Fundamentals in Semiconductor Devices and Fabrication Technology* (Marcel Dekker, Inc.: New York, N.Y. 1998), incorporated in its entirety herein by reference.

Integrated circuit designs are becoming increasingly complex. The number of components and integration density of components in layouts is increasing. Demand for an ever-decreasing minimum feature size is high. The minimum feature size (also called line width) refers to the smallest dimension of a semiconductor feature that can be fabricated within acceptable tolerances. As result, it is increasingly important that photolithographic systems and techniques provide a higher resolution.

One approach to improve resolution is to shorten the wavelength of light used in fabrication. Increasing the numerical aperture (NA) of the optical reduction system also improves resolution. Indeed, commercial exposure systems have been developed with decreasing wavelengths of light and increasing NA. For example, Silicon Valley Group Lithography (SVG), formerly Perkins-Elmer, has introduced a number of ultra-violet exposure systems with catadioptric types of optical reduction systems and step-and-scan reticle/wafer stage systems. See, e.g., Nonogaki, at section 2.5.5, pp. 20–24. These UV exposure systems available from SVG have light sources operating at a wavelength of 248 nanometer (nm) with an associated NA of 0.5 or 0.6, and at a wavelength of 193 nm with an associated NA of 0.5 or 0.6. However, light at wavelengths equal to or less than 170 nm, and for example at 157 nm, has not been made available in photolithographic applications for semiconductor fabrication. A numeric aperture greater than 0.6, and for example at 0.75, is also not available.

Catadioptric optical reduction systems include a mirror that reflects the imaging light after it passes through the reticle onto a wafer. A beam splitter cube is used in the optical path of the system. A conventional beam splitter cube, however, transmits 50% of input light and reflects 50% of the input light. Thus, depending upon the particular configuration of optical paths, significant light loss can occur at the beam splitter.

In UV photolithography, however, it is important to maintain a high light transmissivity through an optical reduction system with little or no loss. Exposure time and the overall semiconductor fabrication time depends upon the intensity or magnitude of light output onto the wafer. To reduce light loss at the beam splitter, a polarizing beam splitter and quarter-wave plates are used.

FIGS. 1A and 1B illustrate an example conventional polarizing beam splitter cube 100 used in a conventional catadioptric optical reduction system. Polarizing beam splitter cuber 100 includes two prisms 110, 150, and a coating interface 120. Prisms 120, 150 are made of fused silica and are transmissive at wavelengths of 248 nm and 193 nm. Coating interface 120 is a multi-layer stack. The multi-layer stack includes alternating thin film layers. The alternating thin film layers are made of thin films having relatively high and low indices of refraction ($n_1$ and $n_2$). The alternating thin film layers and their respective indices of refraction are selected such that the MacNeille condition (also called Brewster condition) is satisfied. In one example, the high index of refraction thin film material is an aluminum oxide. The low index of refraction material is aluminum fluoride. A protective layer may be added during the fabrication of the stack. Cement or glue is included to attach one of the alternating layers to a prism 150 at face 152 or to attach the protective layer to prism 110 at face 112.

As shown in FIG. 2A, the MacNeille condition (as described in U.S. Pat. No. 2,403,731) is a condition at which light 200 incident upon the multi-layer stack is separated into two beams 260, 280 having different polarization states. For example, output beam 260 is an S-polarized beam, and output beam 280 is a P-polarized beam. FIG. 2B shows the advantage of using a polarizing beam splitter in a catadioptric optical reduction system to minimize light loss. Incident light 200 (usually having S and P polarization states) passes through a quarter-wave plate 210. Quarter wave plate 210 converts all of incident light 200 to a linearly polarized beam in an S polarization state. Beam splitter cube 100 reflects all or nearly all of the S polarization to quarter wave plate 220 and mirror 225. Quarter wave plate 220 when doubled passed acts like ahalfwaveplate. See, e.g., "Waveplates," <http://www.casix.com/new/waveplate.htm, two pages. Quarter wave plate 220 converts the S polarization light to circular polarization, and after reflection from mirror 225, converts light into P-polarized light. The P-polarized light is transmitted by beam splitter cube 100 and output as a P-polarized beam 290 toward the wafer. In this way, the polarizing beam splitter 100 and quarter wave plates 210, 220 avoid light loss in a catadioptric optical reduction system that includes a mirror 225. Note, as an alternative, mirror 225 and quarter wave plate 220 can be positioned at face B of cube 100 rather than at face A and still achieve the same complete or nearly complete light transmission over a compact optical path length.

Polarizing beam splitter cube 100, however, is not transmissive at wavelengths less than 170 nm. Prisms 120, 150 are made of fused silica which is opaque at wavelengths less than 170 nm. Similarly, coating interface 120 is also based on the MacNeille condition which is only explicitly described for infra-red wavelengths. Such coatings 120 are not effective at ultraviolet wavelengths less than 170 nm. Cement or glue used in bonding coating interface 120 to fused silica prisms 110, 150 can degrade when exposed to light at 170 nm or less.

What is needed is a polarizing beam splitter that supports an even higher resolution. A polarizing beam splitter is needed that is transmissive to light at ultraviolet wavelengths equal to or less than 170 nm, and for example at 157 nm. A polarizing beam splitter is needed that can image at high quality light incident over a wide range of reflectance and transmittance angles. A polarizing beam splitter is needed that can accommodate divergent light in an optical reduction system having a numeric aperture at a wafer plane greater than 0.6, and for example at 0.75.

SUMMARY OF THE INVENTION

The present invention provides a ultraviolet (UV) polarizing beam splitter. The UV polarizing beam splitter is transmissive to light at wavelengths equal to or less than 170 nm, and for example at 157 nm. The UV polarizing beam splitter can image at high quality light incident over a wide range of reflectance and transmittance angles. The UV polarizing beam splitter can accommodate divergent light in an optical reduction system having a numeric aperture at a wafer plane greater than 0.6, and for example at 0.75. In different embodiments, the UV polarizing beam splitter has a cubic, rectangular cubic, or truncated cubic shape, or approximates a cubic, rectangular cubic, or truncated cubic shape.

In one embodiment, a UV polarizing beam splitter cube comprises a pair of prisms and a coating interface. The prisms are made of at least a fluoride material, such as, calcium fluoride ($CaF_2$) or barium fluoride ($BaF_2$). The coating interface has at least one layer of a thin film fluoride material. In one example implementation, the coating interface includes a multi-layer stack of alternating layers of quarter wavelength thick thin film fluoride materials. The alternating layers of thin film fluoride materials comprise first and second fluoride materials. The first and second fluoride materials have respective first and second refractive indices. The first refractive index is greater than (or higher than) the second refractive index. In one feature of the present invention, the first and second refractive indices form a stack of fluoride materials having relatively high and low refractive indices of refraction such that the coating interface separates UV light (including light at wavelengths equal to or less than 170 nm, and for example at 157 nm) depending on two polarized states.

In one example, the coating interface comprises a multi-layer design of the form $(H\,L)^n\,H$, where H indicates a layer of a quarter wavelength optical thickness of a first fluoride material having a relatively high refractive index. The first fluoride material can include, but is not limited to, gadolinium tri-fluoride ($GdF_3$), lanthanum tri-fluoride ($LaF_3$), samarium fluoride ($SmF_3$), europium fluoride ($EuF_3$), terbium fluoride ($TbF_3$), dysprosium fluoride ($DyF_3$), holmium fluoride ($HoF_3$), erbium fluoride ($ErF_3$), thulium fluoride ($TmF_3$), ytterbium fluoride ($YbF_3$), lutetium fluoride ($LuF_3$), zirconium fluoride ($ZrF_4$), hafnium fluoride ($HfF_4$), yttrium fluoride ($YF_3$), neodymium fluoride ($NdF_3$), any of the other lanthanide series tri-fluorides, metallic fluorides, or other high index, ultraviolet transparent material. L indicates a layer of a quarter wavelength optical thickness of a second fluoride material having a relatively low refractive index. The second fluoride material can include, but is not limited to, magnesium fluoride ($MgF_2$), aluminum tri-fluoride ($AlF_3$), barium fluoride ($BaF_2$), strontium fluoride ($SrF_2$), calcium fluoride ($CaF_2$), lithium fluoride (LiF), and sodium fluoride (NaF), or other low index, ultraviolet transparent material. The value "n" indicates the basic (H L) group is repeated n times in a multi-layer stack, where n is a whole number equal to one or more. In one example, n is between 3 and 15. In another example, n is between 5 and 10.

According to a further feature, the prisms and coating interface are joined by optical contact. No cement is needed.

Further multi-layer designs can be generated by computer iterated design. Layers in a multi-layer stack can also be graded across the hypotenuse face of a prism to adjust layer thicknesses at any point so as to compensate for changes in the incidence angle of the light.

In another embodiment, a UV polarizing beam splitter (cube or truncated cube) can be used in a high resolution catadioptric optical reduction system.

The present invention provides a method for splitting an incident light beam based on polarization state. The method includes the step of orienting a coating interface having at least one layer of a fluoride material at an angle relative to the incident light such that the coating interface transmits incident light in a first polarization state and reflects incident light in a second polarization state. In one example, the method further includes the step of selecting thicknesses of alternating thin film layers and their respective indices of refraction such that the coating interface transmits incident light at a wavelength equal to or less than 170 nm in a first polarization state and reflects incident light at a wavelength equal to or less than 170 nm in a second polarization state.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention. In the drawings:

FIG. 4 is a table showing the materials used for different elements in the UV polarizing beam splitter cube of FIG. 3A.

FIG. 8 is a table showing optics characteristics of the example catadioptric reduction system using the truncated UV polarizing beam splitter cube of FIG. 5 according to the present invention.

Figure 1A:
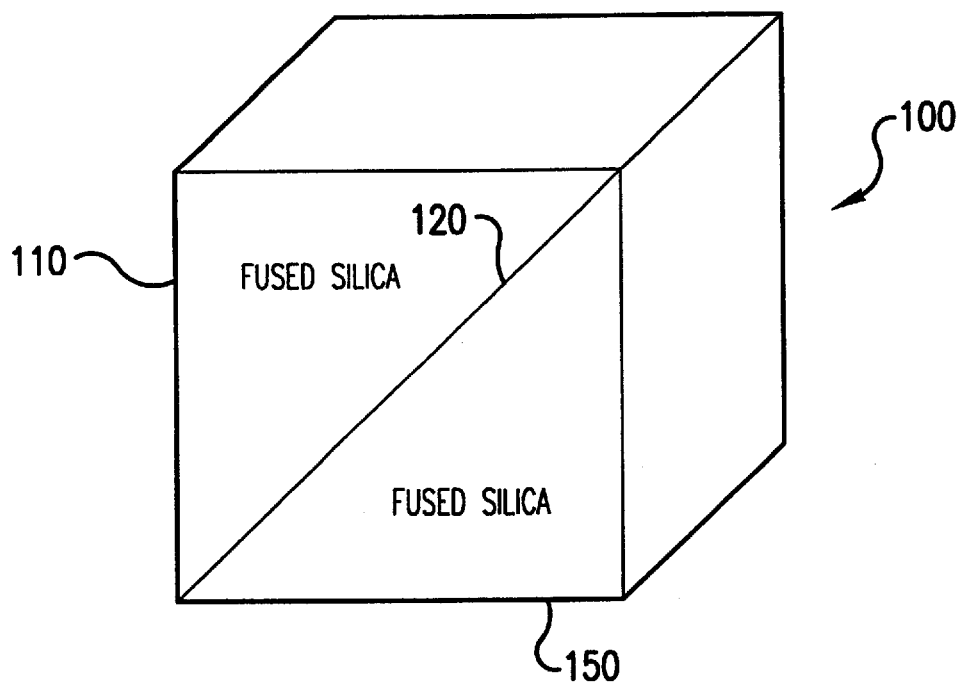
FIG. 1A is a perspective view of a conventional polarizing beam splitter cube.
Figure 1B:
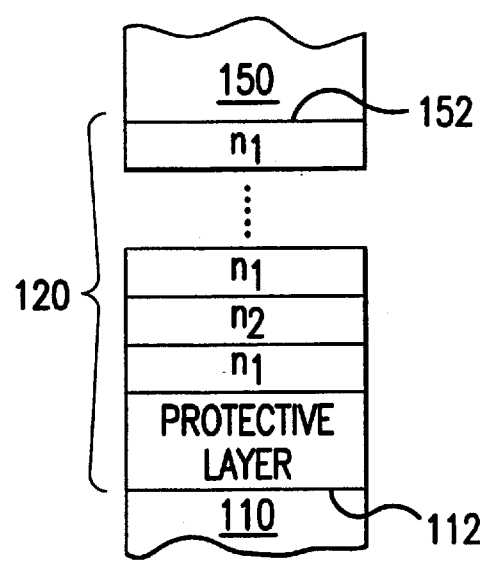
FIG. 1B is a diagram showing a cross-section of a conventional coating interface for the polarizing beam splitter cube of FIG. 1A.
Figure 2A:
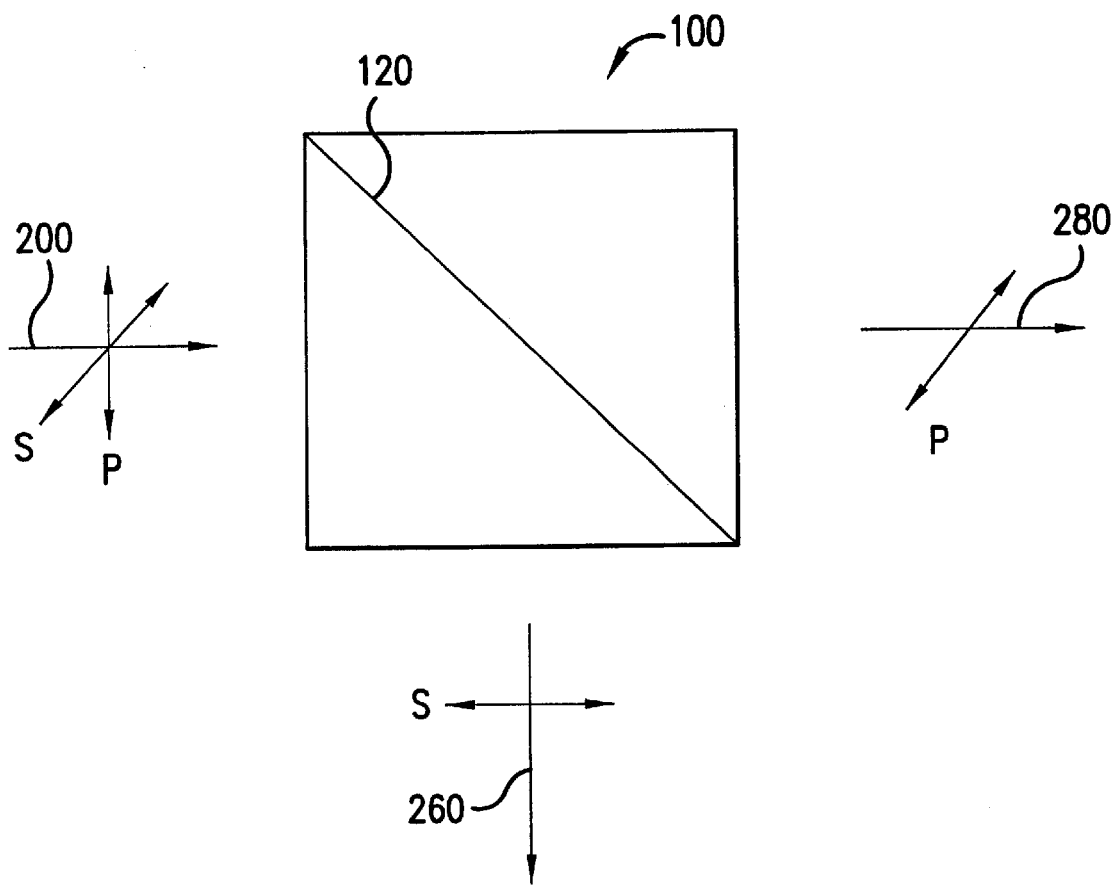
FIG. 2A illustrates how the polarizing beam splitter cube of FIG. 1A separates light into separate polarization states.
Figure 2B:
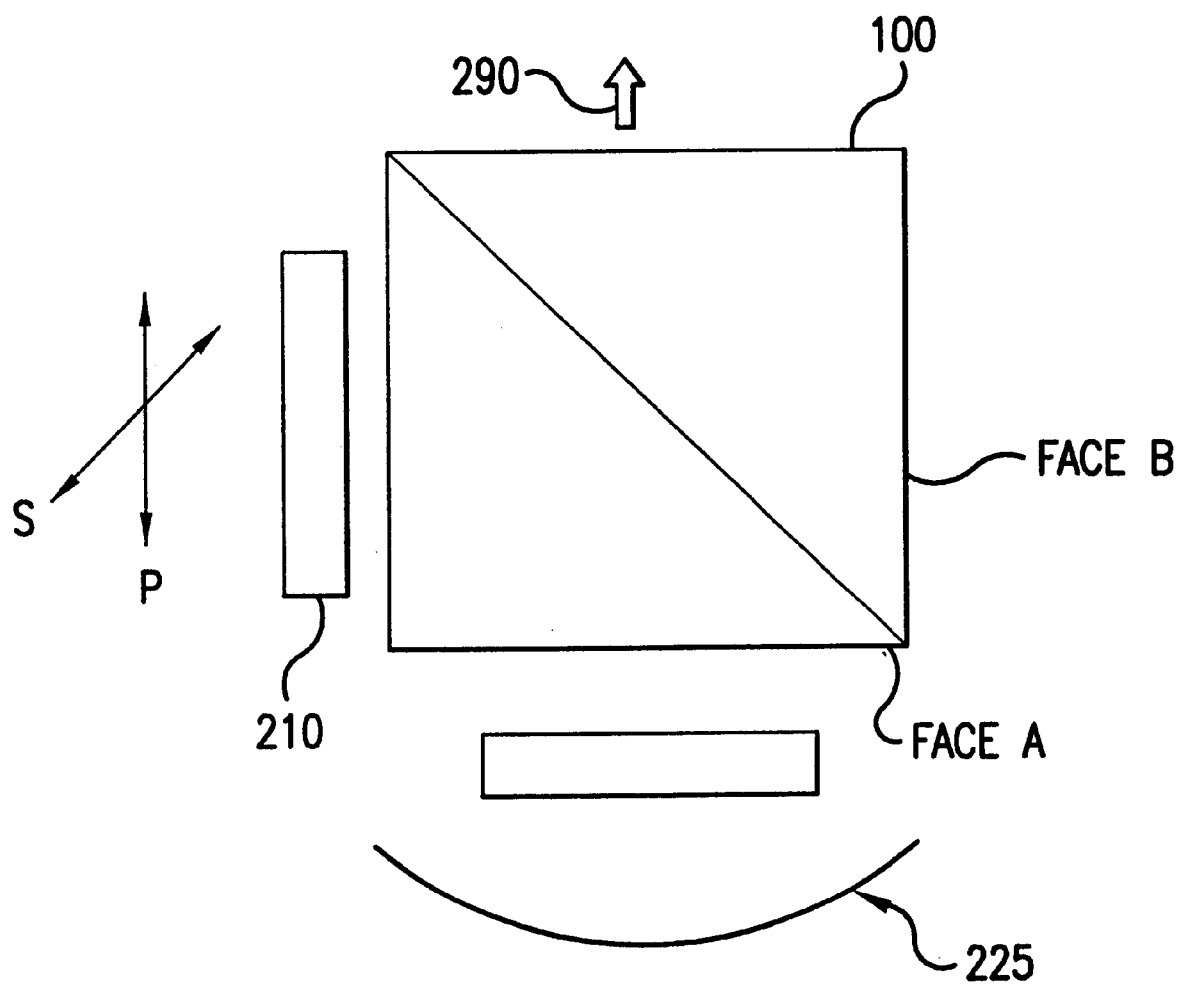
FIG. 2B illustrates how the polarizing beam splitter cube of FIG. 1A can be used as part of a catadioptric optical reduction system to improve transmission efficiency.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Terminology

To more clearly delineate the present invention, an effort is made throughout the specification to adhere to the following term definitions consistently.

The terms "beam splitters" or "cube" used with respect to the present invention have a broad meaning that refers to a beam splitter that includes, but is not limited to, a beam splitter having an overall cubic shape, rectangular cubic shape, or truncated cubic shape, or approximating an overall cubic shape, rectangular cubic shape, or truncated cubic shape.

The term "semiconductor" refers to a solid state substance that can be electrically altered.

The term "semiconductor chip" refers to semiconductor device possessing any number of transistors or other components.

The term "semiconductor device" refers to electronic equipment possessing semiconductor chips or other elements.

The term "long conjugate end" refers to a plane at the object or reticle end of an optical reduction system.

The term "short conjugate end" refers to the plane at the image or wafer end of an optical reduction system.

The term "wafer" refers to the base material in semiconductor manufacturing, which goes through a series of photomasking, etching and/or implementation steps.

The term "wave plate" refers to retardation plates or phase shifters made from materials which exhibit birefringence.

UV Polarizing Beam Splitter

Figure 3A:
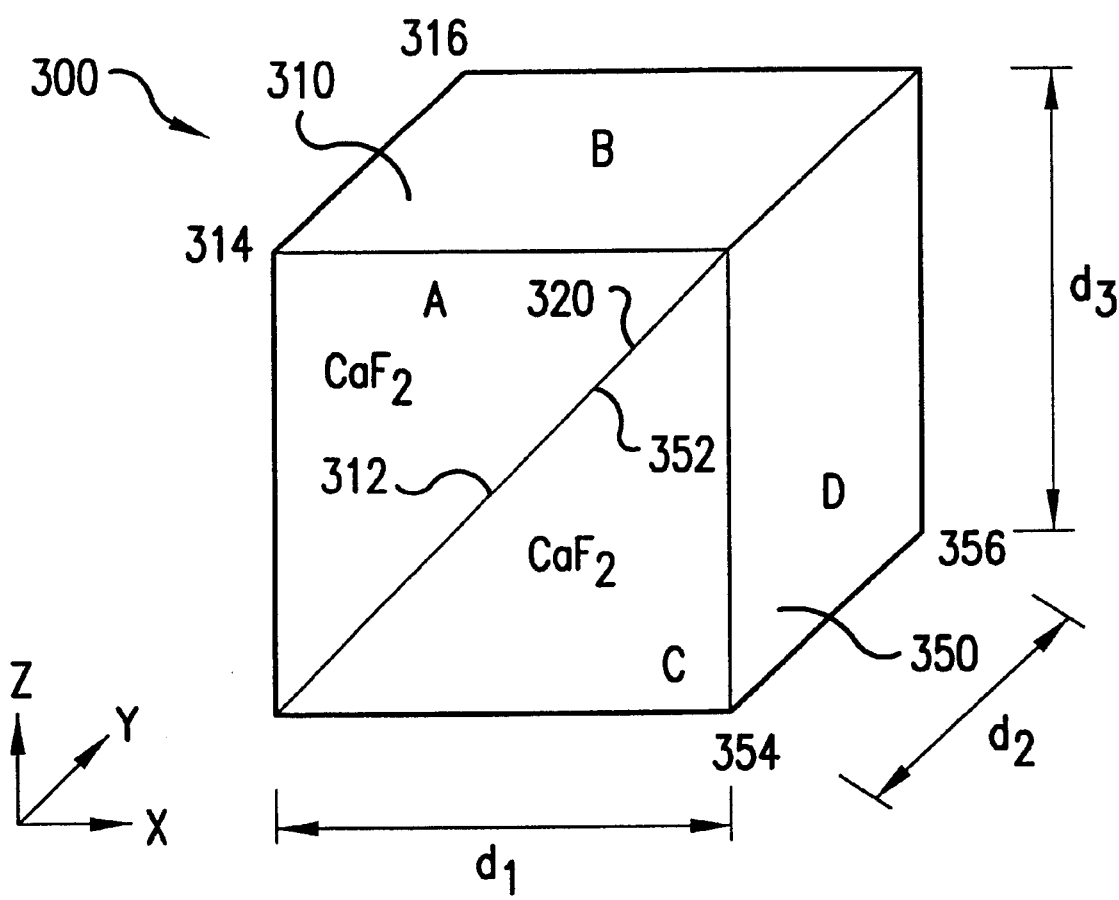
FIG. 3A is a perspective view of a UV polarizing beam splitter cube according to one embodiment of the present invention.

FIG. 3A is a perspective view of a UV polarizing beam splitter cube 300 according to one embodiment of the present invention. UV polarizing beam splitter cube 300 has a pair of prisms 310, 350 and a coating interface 320. Prisms 310, 350 are made of at least a fluoride material. Coating interface 320 has at least one layer of a thin film fluoride material.

In the example shown in FIG. 3A, prism 310 is a right angle prism having five faces. These five faces consist of two side faces, two end faces, and a hypotenuse face. The two side faces are square (or approximately square) at their perimeter and share right angle corners 314 and 316. One side face B is shown in FIG. 3A, the other side face is not shown. The two end faces are both right triangles. One end face A, shown in FIG. 3A, is a right triangle at its perimeter formed by a ninety degree (or approximately ninety degree) angle at corner 314 and two 45 degree (or approximately 45 degree) angles opposite corner 314. The other end face (not shown) is the right triangle formed by a ninety degree (or approximately ninety degree) angle at corner 316 and two 45 degree (or approximately 45 degree) angles opposite corner 316. The hypotenuse face is a planar face 312 which is on a hypotenuse side of right angle prism 310 opposite right angle corners 314, 316.

Prism 350 is also a right angle prism having five faces. These five faces consist of two side faces, two end faces, and a hypotenuse face. The two side faces are square (or approximately square) at their perimeter and share right angle corners 354 and 356. One side face D is shown in FIG. 3A, the other side face is not shown. The two end faces are both right triangles. One end face C, shown in FIG. 3A, is a right triangle at its perimeter formed by a ninety degree (or approximately ninety degree) angle at corner 354 and two 45 degree (or approximately 45 degree) angles opposite corner 354. The other end face (not shown) is the right triangle formed by a ninety degree (or approximately ninety degree) angle at corner 356 and two 45 degree (or approximately 45 degree) angles opposite corner 356. The hypotenuse face is a planar face 352 which is on a hypotenuse side of right angle prism 350 opposite right angle corners 354, 356. Coating interface 320 lies between hypotenuse faces 312 and 352.

UV polarizing beam splitter cube 300 has width, depth, and height dimensions equal to values $d_1$, $d_2$, and $d_3$ respectively, as shown in FIG. 3A. In one example implementation, $d_1$, $d_2$, and $d_3$ are equal (or approximately equal) such that prisms 310 and 350 when coupled along their faces 312 and 352 have an overall cube or cube-like shape. In one example implementation, prisms 310, 350 are made of calcium fluoride ($CaF_2$) material, barium fluoride ($BaF_2$) material, or a combination thereof.

Coating Interface

Figure 3B:
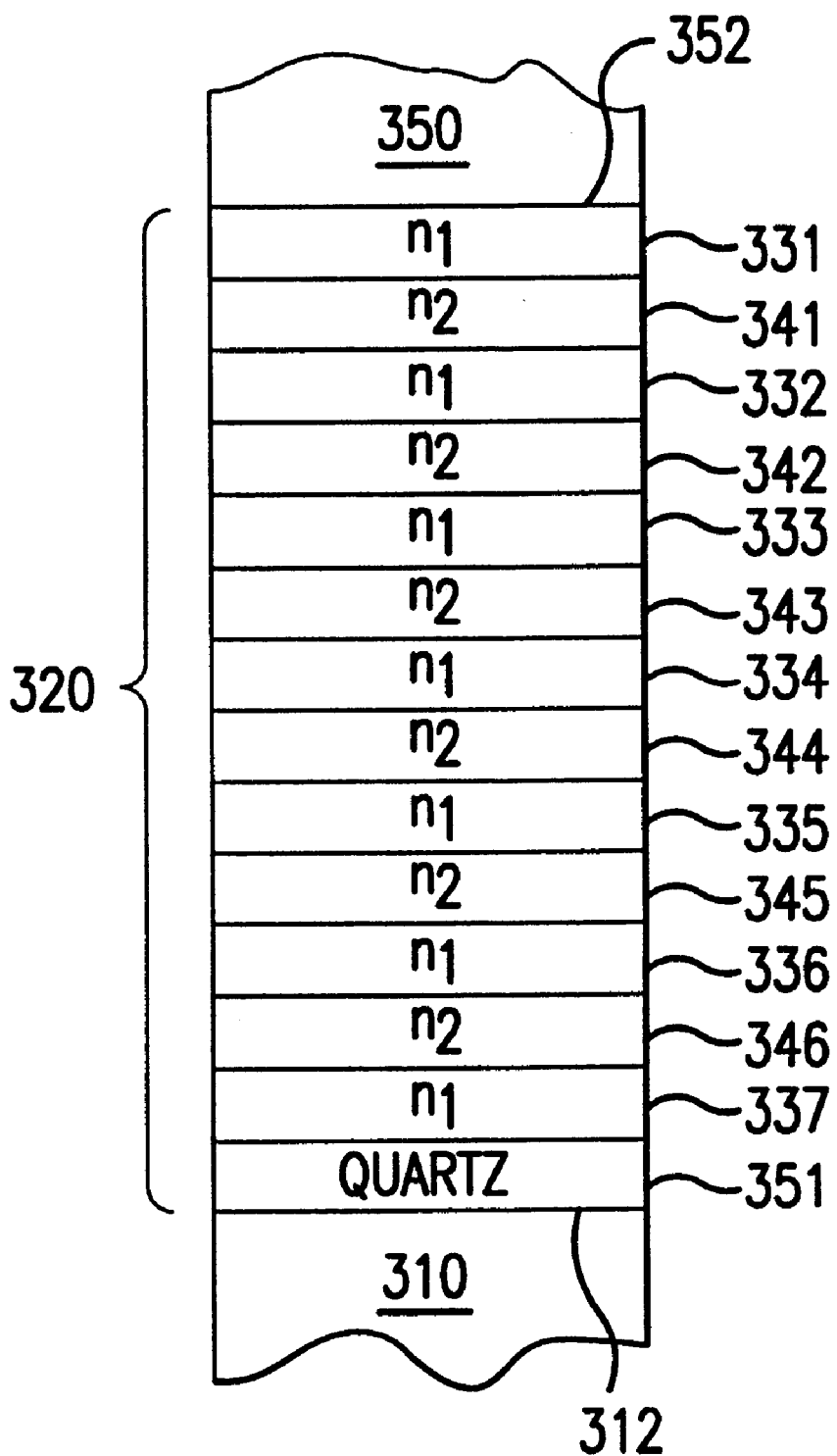
FIG. 3B is a diagram showing a cross-section of a coating interface for the UV polarizing beam splitter cube of FIG. 3A.

FIG. 3B is a diagram showing a cross-section of an example coating interface 320 in greater detail. Coating interface 320 includes a stack of alternating layers of thin film fluoride materials (331–337, 341–346), and a protective layer 351. Each of the layers 331–337, 341–346 has a thickness equal to or approximately equal to one quarter wavelength (or a multiple of a quarter wavelength) of the imaging light. Anti-reflection (AR) coatings (not shown) can also be included in coating interface 320. Protective layer 351 and AR coatings are optional. Also, the present invention in not limited to thirteen layers of alternating layers of thin film fluoride materials. In general, larger and smaller numbers of alternating layers of thin film fluoride materials can be used as would be apparent to a person skilled in the art given this description.

Further, FIG. 3B shows the coating interface 320 mounted on face 352 of prism 350. The stack of alternating layers of thin film fluoride materials (331–337, 341–346) and/or protective layer 351 are grown, etched, or fabricated on face 352 using conventional thin film techniques. Prism 310 is then placed in optical contact with the coating interface 320. In this way, prisms 310 and 350 are coupled strongly through coating interface 320 resulting in a very strong polarizing beam splitter cube. One further feature of the present invention is that it applies this optical contact (where optical components are joined so closely together that van der Waal's forces couple the components to one another) in a complex geometry involving angled surfaces, such as, the hypotenuse face of prism 310.

Figure 3C:
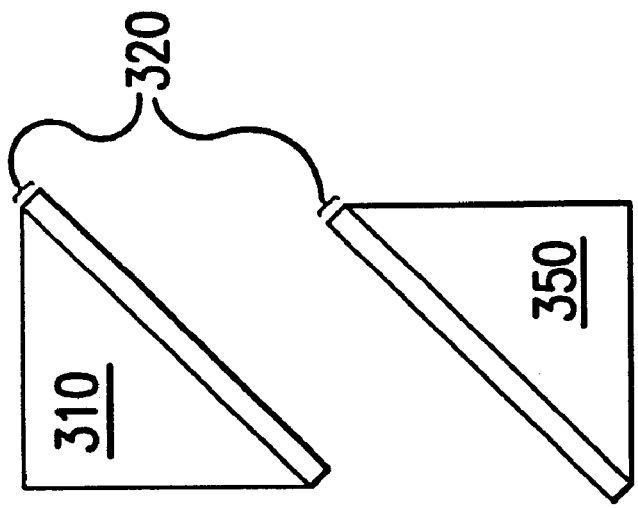
FIG. 3C is a diagram showing three different cases of a coating interface for the polarizing bean splitter cube of FIG. 3A.
Figure 3C:
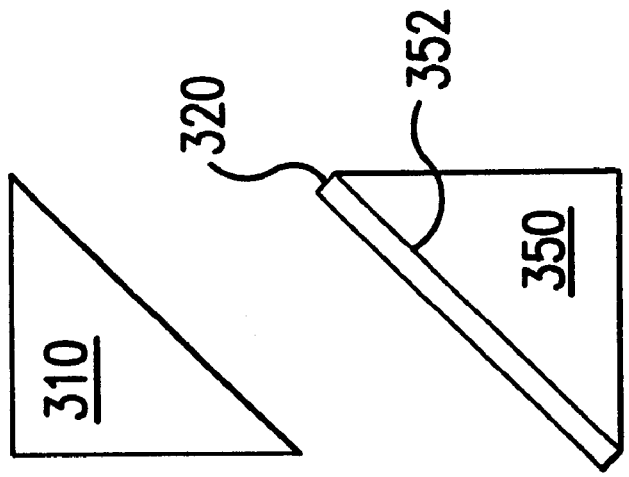
Figure 3C:
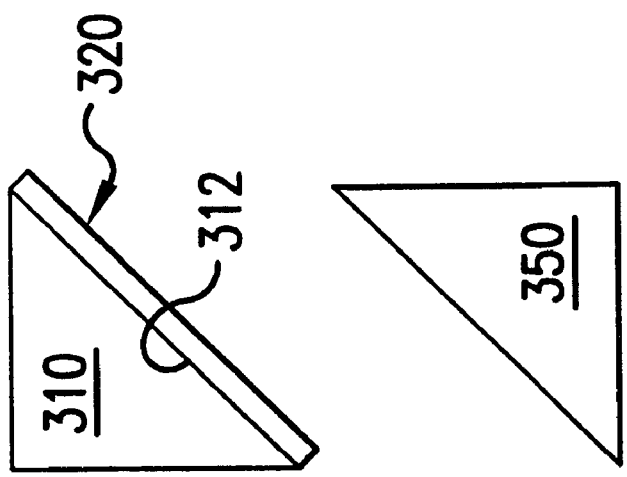

In general, the layers of coating interface 320 (not shown to scale in FIG. 3C) can be fabricated according to three cases (cases 1–3). As shown in FIG. 3C, in case 1, the layers of coating interface 320 are first grown, etched, or fabricated on face 312 of prism 310 prior to making an optical contact with prism 350. In case 2, the layers of coating interface 320 are first grown, etched, or fabricated on face 352 of prism 350 prior to making an optical contact with prism 310. In case 3, part of the layers of coating interface 320 are grown, etched, or fabricated on face 312 of prism 310 and the remainder of the layers of coating interface 320 are grown, etched, or fabricated on face 352 of prism 350 prior to making any optical contact in between prisms 310, 350.

The alternating layers of thin film fluoride materials consist of two groups of layers. The first group of layers 331–337 has a first index of refraction $n_1$. The second group of layers 341–346 has a second index of refraction $n_2$. According to one feature of the present invention, the first and second refractive indices $n_1$ and $n_2$ are different. In particular, the second refractive index $n_2$ is relatively low compared to the first refractive index $n_1$. In this way, coating interface 320 includes a stack of fluoride materials 331–337, 341–346 having alternating relatively high and low refractive indices $n_1$, $n_2$ and quarter wavelength thicknesses such that the coating interface 320 separates incident UV light based on two different polarization states, such as, S and P polarization states. According to the present invention, polarizing beam splitter cube 300 can be used with light at wavelengths equal to or less than 170 nm, and in particular, at 157 nm.

In one example, the coating interface 320 comprises a multi-layer design of the form $(H L)^n H$, where H indicates a layer of a quarter wavelength optical thickness of a first fluoride material having relatively high refractive index. The first fluoride material can include, but is not limited to, gadolinium tri-fluoride ($GdF_3$), lanthanum tri-fluoride ($LaF_3$), samarium fluoride ($SmF_3$), europium fluoride ($EuF_3$), terbium fluoride ($TbF_3$), dysprosium fluoride ($DyF_3$), holmium fluoride ($HoF_3$), erbium fluoride ($ErF_3$), thulium fluoride ($TmF_3$), ytterbium fluoride ($YbF_3$), lutetium fluoride ($LuF_3$), zirconium fluoride ($ZrF_4$), hafnium fluoride ($HfF_4$), yttrium fluoride ($YF_3$), neodymium fluoride ($NdF_3$), any of the other lanthanide series tri-fluorides, metallic fluorides, or other high index, ultraviolet transparent material. L indicates a layer of a quarter wavelength optical thickness of a second fluoride material having relatively low refractive index. The second fluoride material can include, but is not limited to, magnesium fluoride ($MgF_2$), aluminum tri-fluoride ($AlF_3$), barium fluoride ($BaF_2$), strontium fluoride ($SrF_2$), calcium fluoride ($CaF_2$), lithium fluoride (LiF), and sodium fluoride (NaF), or other low index, ultraviolet transparent material. The superscript value "n" indicates the basic (H L) group is repeated n times in a multi-layer stack, where n is a whole number equal to one or more. In one example, n is between 3 and 15. In another example, n is between 5 and 10. Other values of n can be used as would be apparent to person skilled in the art given this description.

FIG. 4 is a table showing the materials used for different elements in the UV polarizing beam splitter cube of FIG. 3A in one example implementation of the present invention. As shown in FIG. 4, prisms 310, 350 are made of $CaF_2$ or $BaF_2$. The first group of layers 331–337 can be made of a first fluoride material that can include, but is not limited to, gadolinium tri-fluoride ($GdF_3$), lanthanum tri-fluoride ($LaF_3$), samarium fluoride ($SmF_3$), europium fluoride ($EuF_3$), terbium fluoride ($TbF_3$), dysprosium fluoride ($DyF_3$), holmium fluoride ($HoF_3$), erbium fluoride ($ErF_3$), thulium fluoride ($TmF_3$), ytterbium fluoride ($YbF_3$), lutetium fluoride ($LuF_3$), zirconium fluoride ($ZrF_4$), hafnium fluoride ($HfF_4$), yttrium fluoride ($YF_3$), neodymium fluoride ($NdF_3$), any of the other lanthanide series tri-fluorides, metallic fluorides, or other high index, ultraviolet transparent material. The second group of layers 341–346 can be made of a second fluoride material that can include, but is not limited to, magnesium fluoride ($MgF_2$), aluminum trifluoride ($AlF_3$), barium fluoride ($BaF_2$), strontium fluoride ($SrF_2$), calcium fluoride ($CaF_2$), lithium fluoride (LiF), and sodium fluoride (NaF), or other low index, ultraviolet transparent material.

Truncated UV Polarizing Beam Splitter

Figure 5:
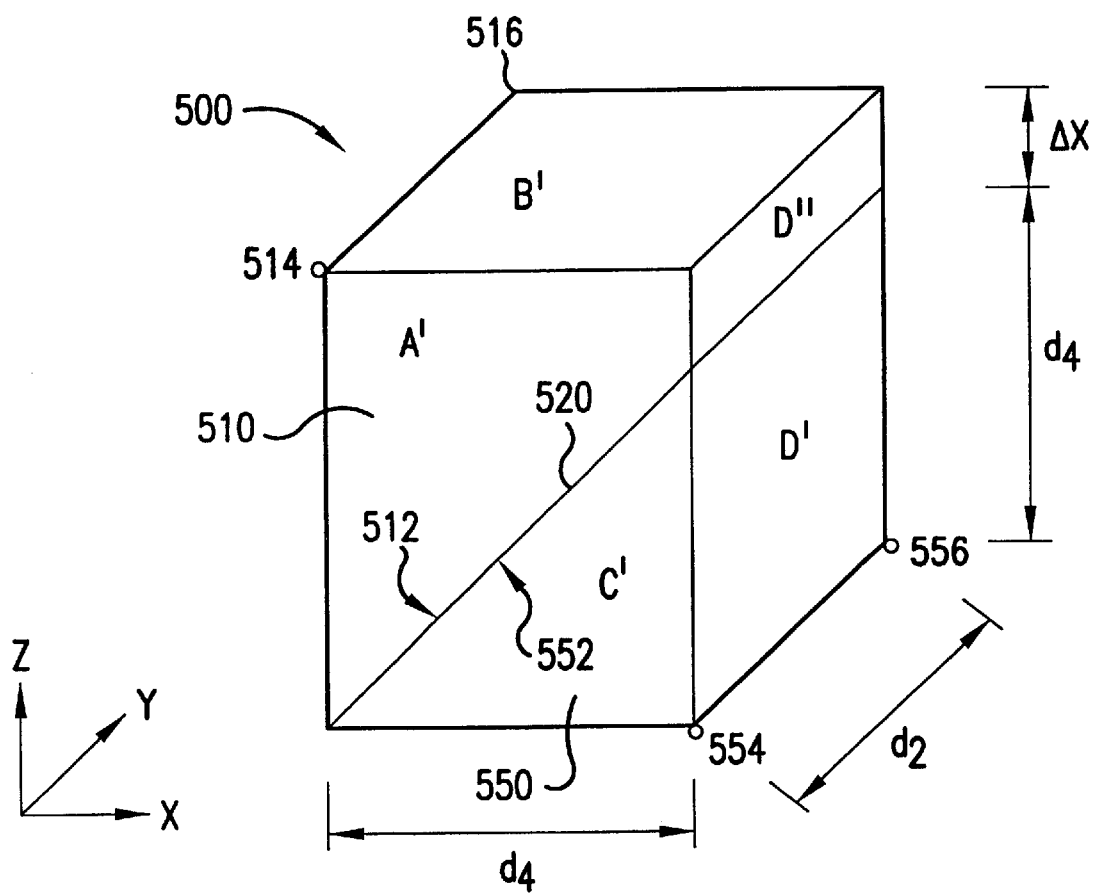
FIG. 5 is a perspective view of a truncated UV polarizing beam splitter cube according to another embodiment of the present invention.

FIG. 5 is a perspective view of a truncated UV polarizing beam splitter cube 500 according to another embodiment of the present invention. Truncated UV polarizing beam splitter cube 500 has a pair of prisms 510, 550 and a coating interface 520. Prisms 510, 550 are made of at least a fluoride material. Coating interface 520 has at least one layer of a thin film fluoride material.

In this example, truncated UV polarizing beam splitter cube 500 is a truncated version of UV polarizing beam splitter cube 300 described above with respect to FIGS. 3–4. In particular, cube 300 is truncated in a y–z plane by a predetermined amount $\Delta x$ in the x dimension. Truncated UV polarizing beam splitter cube 500 then has width, depth, and height dimensions equal to values $d_4$, $d_2$, and $d_3$ respectively, as shown in FIG. 5. In one example implementation, $d_2$ and $d_3$ are equal (or approximately equal). Dimension $d_4$ is less than dimensions $d_2$ and $d_3$ by the amount $\Delta x$. Thus, to arrive at truncated UV beam splitter 500, UV polarizing beam splitter cube 300 has essentially been truncated along the width (x dimension) by a predetermined amount $\Delta x$ (that is, $d_1$ of cube 300 equals $d_4+\Delta x$). In this way, truncated UV polarizing beam splitter cube 500 has a rectangular cubic (or truncated cube) shape. This truncation can be performed after cube 300 is made by grinding, polishing, or other optics manufacturing step. Alternatively, truncated prisms 510, 550 and coating interface 520 can be made prior to applying an optical contact to form truncated UV polarizing beam splitter cube 500.

In the example shown in FIG. 5, prism 510 is a polygonal prism having six faces. These six faces consist of two side faces, two end faces, a hypotenuse face, and a cleaved side face. One side face B' has a rectangular (or approximately rectangular) perimeter having a truncated width equal or approximately equal to $d_4$ and a depth equal or approximately equal to $d_2$. The other side face (not shown) is a square or approximately a square having side dimensions equal or approximately equal to $d_2$. The two end faces are both four-sided trapezoids having four sides of respective lengths $d_4$, $d_3$, $\Delta x$, and the square root of 2 times $d_4$. The hypotenuse face is a planar face 512 which is on a hypotenuse-side of the polygonal prism 510 opposite right angle corners 514, 516. Cleaved face D" is a rectangular or approximately rectangular face with two sides having a depth equal or approximately equal to $\Delta x$, and two sides equal or approximately equal to $d_2$.

Prism 550 is a right angle prism having five faces. These five faces consist of two side faces, two end faces, and a hypotenuse face. The two side faces are rectangular (or approximately rectangular) at their perimeters and share right angle corners 554 and 556. One side face D' is shown in FIG. 5 and has a depth equal or approximately equal to $d_2$ and a height equal to or approximately equal to $d_4$. The other side face (not shown) has a depth equal or approximately equal to $d_2$ and a width equal to or approximately equal to $d_4$. The two end faces are both right triangles. One end face C', shown in FIG. 5, is a right triangle at its perimeter formed by a ninety degree (or approximately ninety degree) angle at corner 554 and two 45 degree (or approximately 45 degree) angles opposite corner 554. The sides of the right triangle have a length equal to or approximately equal to $d_4$. The other end face (not shown) is the right triangle formed by a ninety degree (or approximately ninety degree) angle at corner 556 and two 45 degree (or approximately 45 degree) angles opposite corner 356. The hypotenuse face is a planar face 552 which is on a hypotenuse side of right angle prism 550 opposite right angle corners 554, 556. Coating interface 520 lies between hypotenuse faces 512 and 552. Coating interface 520 is identical to coating interface 320 as described in all of the embodiments above expect for the area of the interface covers a smaller, truncated area.

The present invention also provides a method for splitting an incident light beam based on polarization state. The method includes the step of orienting a coating interface having at least one layer of a fluoride material at an angle relative to the incident light (e.g. at or approximately a 45 degree angle) such that the coating interface transmits incident light in a first polarization state and reflects incident light in a second polarization state. In one example, the method further includes the step of arranging alternating thin film quarter wavelength thick layers and their respective indices of refraction as described above such that such that the coating interface transmits incident light at a wavelength equal to or less than 170 nm in a first polarization state and reflects incident light at a wavelength equal to or less than 170 nm in a second polarization state.

Alternative Designs

Other designs for a multi-layer coating interface 320, 520 can be generated through a computer iterated technique as would be apparent to a person skilled in the art given this description. Designs with wedged layer thicknesses can also be used. In order to improve the performance in situations of high beam convergence (high numerical apertures over 0.5 NA) the layer thicknesses of either of the above types of multi-layer designs can be graded across the hypotenuse of the prisms as described by U.S. Pat. No. 2,740,317 issued to Kelley (incorporated by reference herein in its entirety). Under this approach, the layer thicknesses are adjusted at any point on the surface to compensate for changes in the incidence angle of the light at that point. For example, the thicknesses of any one or more layers 331–337, 341–346 can be greater or smaller than. a.quarter wavelength thickness at points across the respective layer. Such graded thickness can compensate for changes in the reflectance and transmittance angles of divergent light incident at the coating interface.

Example Catadioptric Optical Reduction System Using UV Polarizing Beam Splitter

Figure 6:
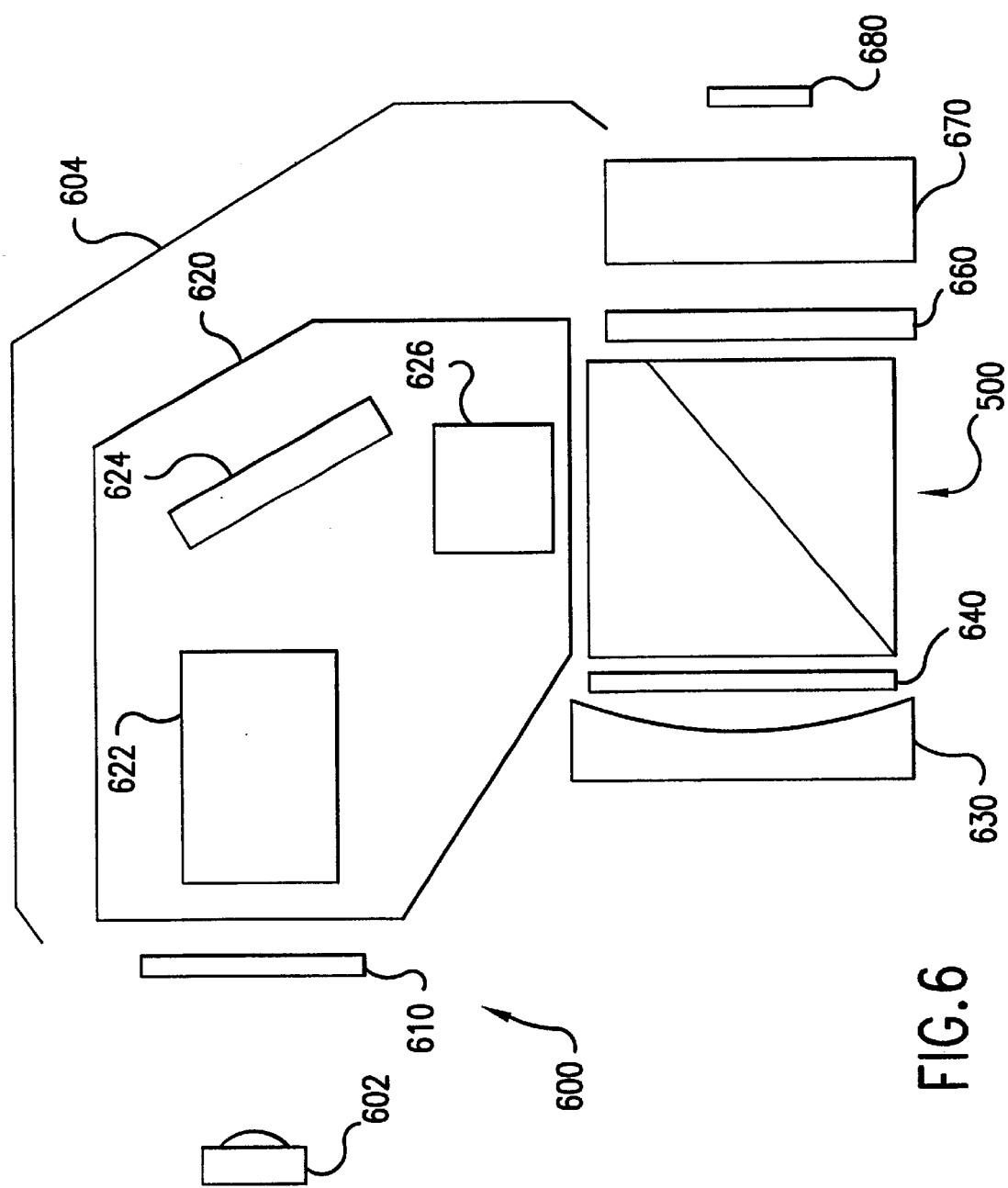
FIG. 6 is a cross-sectional view of an example exposure system that includes a catadioptric reduction system using the truncated UV polarizing beam splitter cube of FIG. 5 according to the present invention.

FIG. 6 is a cross-sectional view of an example exposure system 600. Exposure system 600 includes a light source 602, reticle 610, catadioptric optical reduction system 604, and wafer 680. Alignment and step and scan stages and other mechanical components are omitted for clarity. Light source 602 illuminates imaging light at a wavelength at or less than 170 nm, and preferably at 157 nm. The numeric aperture of exposure system 600 is greater than 0.6, and in one preferred example is at 0.75 with a 26 mm field height.

During exposure, light emitted from source 602 passes through reticle 610 to catadioptric optical reduction system 604. Catadioptric optical reduction system 604 reduces the image of the reticle (or part of the reticle in a step and scan system) by a predetermined ratio, such as, 4:1. A reduced reticle image is output from catadioptric optical reduction system 604 onto wafer 680.

Catadioptric optical reduction system 604 includes a truncated UV polarizing beam splitter cube 500 of FIG. 5 according to the present invention. Of course, UV polarizing beam splitter cube 300 can also be used as desired. Other components in catadioptric optical reduction system 604 include a lens unit 620 (having a first lens group 622, folding mirror 624, and a second lens group 626), a first quarter-wave plate 640, a concave mirror 630, a second quarter-wave plate 660, and a third lens group 670.

Many components are similar to the components in conventional catadioptric optical reduction systems with several differences. Such conventional optical reduction systems include the conventional optical system disclosed in U.S. Pat. No. 5,537,260 entitled "Catadioptric Optical Reduction System with High Numerical Aperture" issued Jul. 16, 1996 to Williamson, which is incorporated by reference herein in its entirety. This reference describes an optical reduction system having a numerical aperture of 0.35. Another optical system is described in U.S. Pat. No. 4,953,960 entitled "Optical Reduction System" issuing Sep. 4, 1990 to Williamson, which is incorporated by reference herein in its entirety. This reference describes an optical system operating in the range of 248 nanometers and having a numerical aperture of 0.45. Among other things, these differences include the use of UV polarizing beam splitter 500 (or 300), the use of fluoride material (such as calcium fluoride) in components in catadioptric optical reduction system 604, and approximately a 25% greater size (in one example, lens diameters are between 50 mm to 230 mm).

In one example implementation, not intended to necessarily limit the present invention, first lens group 622 comprises a shell, a spaced doublet including positive lens and negative lens, and positive lens. The shell is an almost zero power or zero power lens. The second lens group 626 comprises a positive lens, a spaced doublet including a negative lens and a positive lens, and negative lens. The third lens group 670 comprises two positive lenses, which are strongly positive, shell, and two positive lenses, which are weakly positive. Folding mirror 624 is optional; however, the folding mirror permits the object and image planes to be parallel which is convenient for one intended application of the optical system of the present invention, which is the manufacture of semiconductor devices using photolithography with a step and scan system.

Radiation (also called light) from light source 602 passes through reticle 610, enters the first lens group 622, reflects from the folding mirror 624, and passes through the second lens group 626. The radiation enters the UV polarizing beamsplitter cube 500. In one embodiment, this radiation is linearly polarized in one polarization state (e.g. S polarization) prior to entry into the UV polarizing beamsplitter cube 500 to minimize loss and maximize transmission efficiency through the optical reduction system 604. UV polarizing beamsplitter cube 500 then reflects the linearly polarized light in one polarized state toward quarter wave plate 640 and concave mirror 630. The light reflecting from concave mirror returns through quarter waveplate 640 and is then is the other polarization state (e.g., P polarization) that cube 500 transmits. The light then passes through quarter-wave plate 660 and lens group 670 and is focused at the wafer 680 at image or wafer plane. Additionally, by increasing the numerical aperture in lens group 670, after the concave mirror 630 and beamsplitter cube 500, the greatest angular range is not seen in these elements.

Lens groups upstream of the mirror, 622 and 626, need only provide enough power to image the entrance pupil at infinity to an aperture stop (not shown) at or near the concave mirror 630. The combined power of lens groups 622 and 626 is slightly negative. The shell and air spaced doublet in lens group 622 assist in aberration corrections including astigmatism, field curvature, and distortion. The lens group 670, after the concave mirror 630, provides most of the reduction from object to image size, as well as projecting the aperture stop to an infinite exit pupil. Lens group 670 includes two strongly positive lenses to provide a high numerical aperture at the image and exit pupils and infinity. A shell has almost no power. Two weakly positive lenses are included after the shell in lens group 670 to help correct high order aberrations. Concave mirror 630 may provide a reduction ratio in addition to that of the total system.

Second lens group 626 includes a negative lens to provide a strongly diverging beam directed at the beamsplitter cube 500 and concave mirror 630. A strongly positive lens is added to provide lateral color correction. An air space doublet comprising two lenses helps to correct spherical aberrations and coma. Concave mirror 630 is preferably aspheric, therefore helping further reduce high order aberrations.

Figure 7:
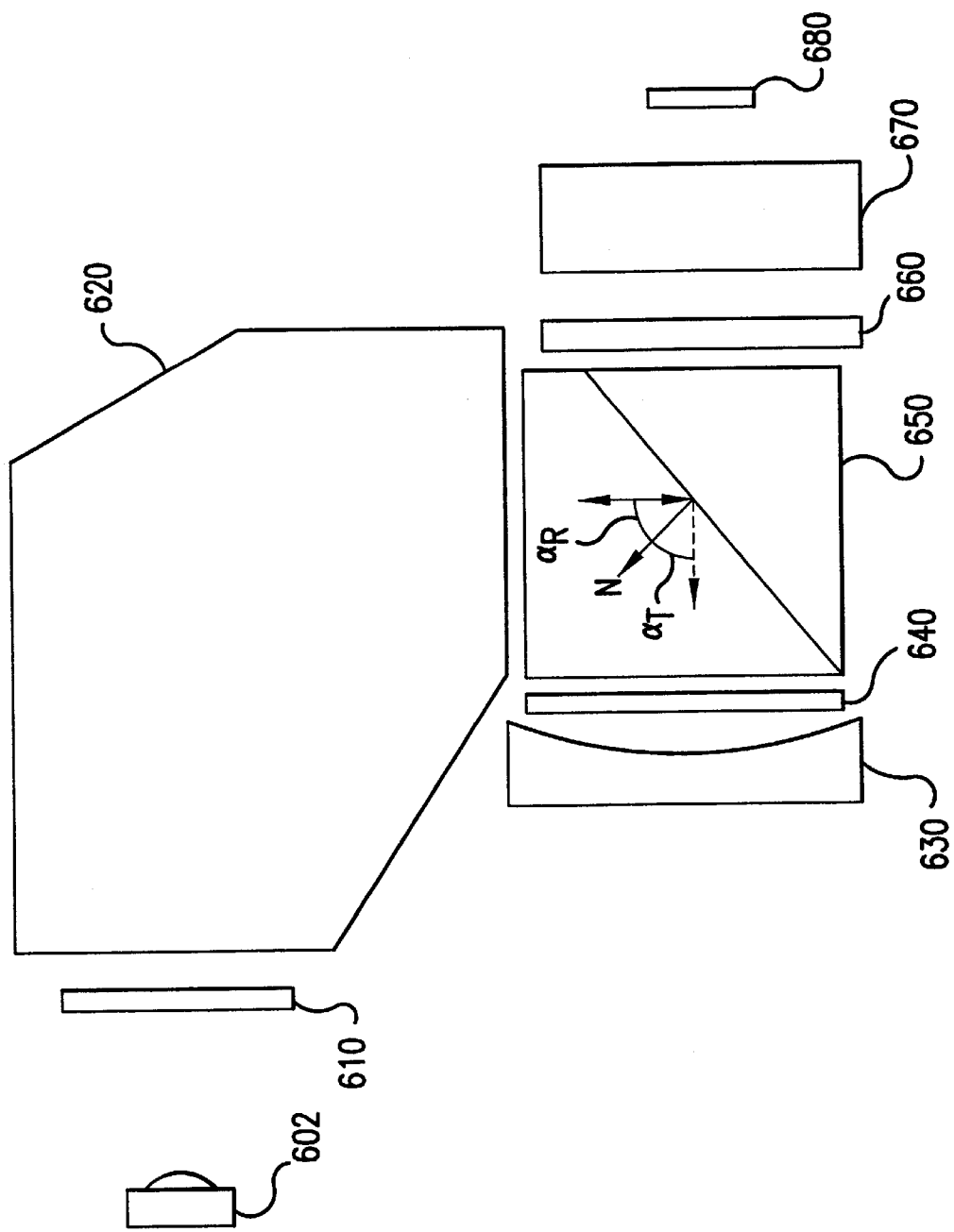
FIG. 7 is a diagram illustrating reflectance and transmittance angles at the coating interface of the truncated UV polarizing beam splitter cube of FIG. 5.

One advantage of the UV polarizing beam splitter cube 300, 500 is that it can accommodate a high NA and a relatively broad range of reflectance and transmittance angles at the coating interface. FIG. 7 is a diagram illustrating reflectance and transmittance angles at the coating interface of the UV polarizing beam splitter cube of FIG. 5. In particular, a reflectance angle is the angle ($\alpha_r$) between the light from lens unit 620 and a normal N at the coating interface. The transmittance angle is the angle ($\alpha_T$) between the light reflecting from mirror 630 and the normal N at the coating interface. FIG. 8 is a table showing optics characteristics of the example catadioptric reduction system 600 using the UV polarizing beam splitter cube 500 according to the present invention. Three examples are shown. Each example supports a wavelength in the ultraviolet range and less than 170 nm (e.g., 157 nm). In the first example, a system with NA of 0.5 can accommodate light over a range of reflectance angles at 45° plus or minus 5°, and transmittance angles at 45° plus or minus 12°. In the second example, a system with NA of 0.6 can accommodate light over a range of reflectance angles at 45° plus or minus 7°, and transmittance angles at 45° plus or minus 15°. In the third example, a system with NA of 0.75 can accommodate light over a range of reflectance angles at 45° plus or minus 10°, and transmittance angles at 45° plus or minus 10°.

Conclusion

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An ultraviolet (UV) polarizing beam splitter, comprising:
   (a) a first prism made of at least one fluoride material;
   (b) a second prism made of at least one fluoride material; and
   (c) a coating interface coupled between said first and second prisms, said coating interface having at least one layer of a fluoride material; whereby, the UV polarizing beam splitter is transmissive to light at wavelengths equal to or less than 170 nm.

2. The beam splitter of claim 1, wherein said first and second prisms comprise calcium fluoride.

3. The beam splitter of claim 2, wherein said first and second prisms each comprise right angle prisms, whereby, the UV polarizing beam splitter is in the shape of a cube.

4. The beam splitter of claim 2, wherein said first prism comprises a prism having an end face that includes a right angle or approximately a right angle.

5. The beam splitter of claim 2, wherein said first prism and said second prism each comprise a prism having two side faces, two end faces, and a hypotenuse face.

6. The beam splitter of claim 2, wherein said first prism comprises a cleaved right angle prism having two end faces each shaped like a trapezoid, and said second prism comprises a right angle prism having two end faces with sides of a length truncated by a predetermined amount; whereby, the UV polarizing beam splitter is in the shape of a rectangular cube representative of a cube truncated in one dimension.

7. The beam splitter of claim 1, wherein said coating interface comprises a stack of alternating layers of thin film fluoride materials.

8. The beam splitter of claim 7, wherein said alternating layers of thin film fluoride materials comprise first and second groups of layer; said first group of layers comprising a first fluoride thin film material having a first refractive index, and said second group of layers comprising a second fluoride thin film material having a second refractive index; said first refractive index is greater than said second refractive index.

9. The beam splitter of claim 8, wherein said first fluoride material comprises at least one of thin film made of at least one of gadolinium tri-fluoride ($GdF_3$) or lanthanum tri-fluoride ($LaF_3$), and said second fluoride material comprises at least one thin film made of magnesium fluoride ($Mg_2$) or aluminum tri-fluoride ($AlF_3$).

10. The beam splitter of claim 8, wherein said first fluoride material comprises at least one of thin film made of at least one of samarium fluoride ($SmF_3$), europium fluoride ($EuF_3$), terbium fluoride ($TbF_3$), dysprosium fluoride ($DyF_3$), holmium fluoride ($HoF_3$), erbium fluoride ($ErF_3$), thulium fluoride ($TmF_3$), ytterbium fluoride ($YbF_3$), lutetium fluoride ($LuF_3$), zirconium fluoride ($ZrF_4$), hafnium fluoride ($HfF_4$), yttrium fluoride ($YF_3$), or neodymium fluoride ($NdF_3$), and said second fluoride material comprises at least one thin film made of barium fluoride ($BaF_2$), strontium fluoride ($SrF_2$), calcium fluoride ($CaF_2$), lithium fluoride (LiF), or sodium fluoride (NaF).

11. The beam splitter of claim 8, wherein said alternating layers each have a quarter wavelength or multiple quarter wavelength thickness.

12. The beam splitter of claim 1, wherein at least one layer in said alternating layers has a graded thickness at points across the layer to compensate for a reflectance or transmittance angle of incident light.

13. The beam splitter of claim 1, wherein said coating interface is fabricated on a hypotenuse face of said first prism or a hypotenuse face of said second prism.

14. The beam splitter of claim 8, wherein at least one layer of said coating interface is fabricated on both a hypotenuse face of said first prism and a hypotenuse face of said second prism.

15. The beam splitter of claim 1, wherein said coating interface includes an outer layer, and said outer layer is coupled by an optical contact to either a hypotenuse face of said first prism or a hypotenuse face of said second prism.

16. The beam splitter of claim 1, wherein said coating interface is coupled between a hypotenuse face of said first prism and a hypotenuse face of said second prism at a 45 degree angle or at approximately a 45 degree angle with respect to the direction of an incident light, such that said coating interface can transmit incident light in a first polarization state and reflect incident light in a second polarization state.

17. The beam splitter of claim 1, wherein said first and second prisms and said coating interface can separate light incident over a wide range of angles corresponding to a numeric aperture greater than 0.6.

18. The beam splitter of claim 1, wherein said first and second prisms and said coating interface can separate light incident over a wide range of angles corresponding to a numeric aperture equal to 0.75.

19. The beam splitter of claim 1, wherein said first and second prisms and said coating interface can transmit light at a wavelength of 157 nm.

20. A high resolution catadioptric optical reduction system, comprising:
    a first prism made of at least one fluoride material;
    a second prism made of at least one fluoride material; and
    a coating interface coupled between said first and second prisms, said coating interface having at least one layer of a fluoride material; whereby, the UV polarizing beam splitter is transmissive to light at wavelengths equal to or less than 170 nm.

21. A method for splitting an incident light beam based on polarization state, comprising the steps of:
    orienting a coating interface having at least one layer of a fluoride material at an angle relative to the incident light such that the coating interface transmits incident light in a first polarization state and-reflects incident light in a second polarization state; and
    selecting thicknesses of alternating thin film layers and their respective indices of refraction in the coating interface such that the coating interface transmits incident light at a wavelength equal to or less than 170 nm in a first polarization state and reflects incident light at a wavelength equal to or less than 170 nm in a second polarization state.

* * * * *